United States Patent
Ono et al.

(10) Patent No.: US 6,555,790 B1
(45) Date of Patent: Apr. 29, 2003

(54) SEMICONDUCTOR MANUFACTURING APPARATUS, METHOD FOR CLEANING THE SEMICONDUCTOR MANUFACTURING APPARATUS, AND LIGHT SOURCE UNIT

(75) Inventors: Yoshiharu Ono, Tokyo (JP); Sachiko Hattori, Tokyo (JP); Yuko Odamura, Hyogo (JP)

(73) Assignees: Mitsubishi Denki Kabushiki Kaisha, Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 0 days.

(21) Appl. No.: 09/547,925

(22) Filed: Apr. 11, 2000

(30) Foreign Application Priority Data

Sep. 8, 1999 (JP) ............................ 11-254571

(51) Int. Cl.[7] ................................. F27B 5/14
(52) U.S. Cl. ...................... 219/390; 219/405; 219/411; 392/416; 250/492.2
(58) Field of Search ................................. 219/390, 403, 219/405, 411; 392/416, 418; 118/724, 725, 50.1; 250/492.2

(56) References Cited

U.S. PATENT DOCUMENTS 6,098,637 A * 8/2000 Parke .......................... 134/1.1
6,165,273 A * 12/2000 Fayfield et al. .............. 118/722
6,319,321 B1 * 11/2001 Hiraga et al. ................ 118/666

FOREIGN PATENT DOCUMENTS

JP          6-343938          12/1994

* cited by examiner

*Primary Examiner*—Teresa Walberg
*Assistant Examiner*—Shawntina Fuqua
(74) *Attorney, Agent, or Firm*—McDermott, Will & Emery

(57) ABSTRACT

There is described a semiconductor manufacturing apparatus for coating the surface of a semiconductor wafer with an organic coating, such as anti-reflective coating, which shortens a down time required in association with removal of compounds that tend to sublime and enables simplification of removal of the compounds and an increase in safety of the removal operation. A top plate of a hot plate unit for heating a semiconductor wafer is formed from light-transmissive material such as quartz. A light source unit for illuminating UV-rays effective for decomposing organic compounds is disposed on the top plate. The hot plate unit bakes the semiconductor wafer coated with the organic material, and compounds that have a tendency to sublime including organic material adhere to the lower surface of the top plate in association with the baking operation. Every time a predetermined number of semiconductor wafers have been processed by the hot plate unit, the light source unit radiates UV-rays onto the compounds adhering to the top plate.

11 Claims, 2 Drawing Sheets

SEMICONDUCTOR MANUFACTURING APPARATUS, METHOD FOR CLEANING THE SEMICONDUCTOR MANUFACTURING APPARATUS, AND LIGHT SOURCE UNIT

BACKGROUND OF THE INVENTION

1. Field of the Invention

The present invention relates to a semiconductor manufacturing apparatus, a method for cleaning the semiconductor manufacturing apparatus, and a light source unit, and more particularly, to a semiconductor manufacturing apparatus for coating the surface of a semiconductor wafer with an organic film such as anti-reflective coating, a method suitable for cleaning the semiconductor manufacturing apparatus, and a light source unit suitable for performing the cleaning method.

2. Description of the Background Art

Processes for manufacturing a semiconductor device include a process for forming an organic film, such as a resist film or anti-reflective coating (ARC), on a semiconductor wafer. Such an organic film is usually formed by spin-coating a semiconductor wafer with organic material and baking the semiconductor wafer on a hot plate.

The organic material often contains compounds that tend to sublime (hereinafter called "sublimation compounds"). The sublimation compounds contained in the organic material sublime to gaseous form while the semiconductor wafer is baked on the hot plate, rise to a top plate of the hot plate unit, and adhere to the top plate. If an organic film is formed while a large amount of organic compounds adhere to the top plate, the semiconductor wafer may be contaminated by the compounds. In order to work around the contamination, the top plate of the hot plate unit is removed every time a predetermined number of semiconductor wafers have been processed, and the sublimation compounds are manually removed through use of an organic solvent.

In order to manually remove the compounds adhering to the top plate, the hot plate, which is heated to a temperature of about 100 to 200° C. under normal operation, must be cooled to close to room temperature before removal of the top plate. Thus, the conventional cleaning method encounters a problem of lengthening a period of time during which the semiconductor manufacturing apparatus provided with the hot plate unit becomes idle in association with cleaning of the top plate. Hereinafter, the period of time is referred to as "down time." Further, the above-described conventional method under which the compounds adhering to the top plate are manually removed through use of the organic solvent involves a safety problem.

SUMMARY OF THE INVENTION

The present invention has been conceived to solve such problems involved in the conventional cleaning method, and a first object of the present invention is to provide a semiconductor manufacturing apparatus which enables a reduction in down time associated with removal of sublimation compounds, as well as safe and simple removal of the compounds.

A second object of the present invention is to provide a method for cleaning a semiconductor manufacturing apparatus which is suitable for safely and simply removing sublimation compounds adhering to the semiconductor manufacturing apparatus provided with a hot plate, within a short period of time.

A third object of the present invention is to provide a light source unit useful for performing the cleaning method.

The above objects of the present invention are achieved by a semiconductor manufacturing apparatus including a heating unit for heating a semiconductor wafer. The apparatus includes a top plate which is positioned above a semiconductor wafer to be processed within the heating unit. The top plate has a facing surface facing to the semiconductor wafer and a non-facing surface provided opposite side of the facing surface. The apparatus also includes a light source unit for radiating light including UV-rays having a predetermined wavelength onto the facing surface of the top plate.

The above objects of the present invention are also achieved by a method for cleaning a semiconductor manufacturing apparatus including a heating unit for forming an organic film on the surface of a semiconductor wafer. In the method, a top plate of the heating unit is exposed to light including UV-rays having a predetermined wavelength while the semiconductor wafer is transported out of the heating unit.

The above objects of the present invention are further achieved by a light source unit for radiating light including UV-rays having a predetermined wavelength onto a top plate of a heating unit for forming an organic film on the surface of a semiconductor wafer. The unit includes a circular housing whose diameter is substantially equal to that of the semiconductor wafer. A plurality of lamps are arranged over the entire interior area of the housing at substantially uniform density. The lamps illuminate light including UV-rays having the predetermined wavelength. A power supply unit is also housed within the housing for supplying power to the lamps. The light source unit is designed so as to be less than 4 cm in the height thereof.

Other objects and further features of the present invention will be apparent from the following detailed description when read in conjunction with the accompanying drawings.

DESCRIPTION OF THE PREFERRED EMBODIMENTS

Figure 1:
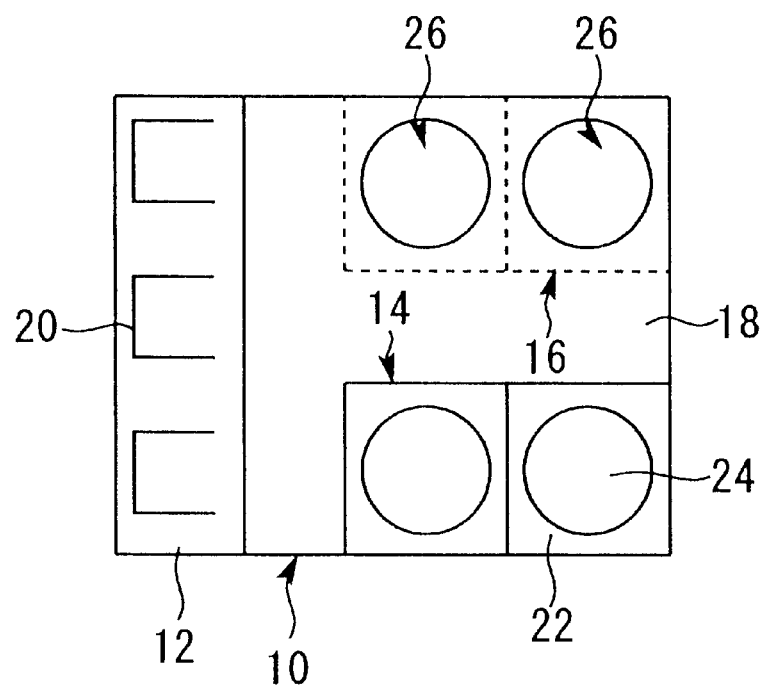
FIG. 1 is a conceptual plan view showing the structure of a semiconductor manufacturing apparatus according to a first embodiment of the present invention.

In the following, principles and embodiments of the present invention will be described with reference to the accompanying drawings. Throughout the drawings, like reference numerals designate like elements, and repetitions of their explanations are omitted here for brevity.

First Embodiment

FIG. 1 is a conceptual plan view showing the structure of a semiconductor manufacturing apparatus according to a first embodiment of the present invention. The semiconductor manufacturing apparatus 10 is the one to form an organic film, such as a resist film, an ARC film, or an overcoat film, on the surface of an unillustrated semiconductor wafer. A carrier stage 12, a coating stage 14, and a hot plate stage 16 are provided within the semiconductor manufacturing apparatus 10. A transport region 18 to be used for transporting a semiconductor wafer is ensured in the area between the stages 12, 14, and 16.

A plurality of cassette retainers 20 are provided in the carrier stage 12. An unillustrated wafer cassette housing a plurality of semiconductor wafers is loaded on each of the cassette retainers 20. A wafer loaded on the carrier stage 12 is transported to the coating stage 14 or the hot plate stage 16 by means of an unillustrated transport arm.

A plurality of independent coating chambers 22 are provided in the coating stage 14. A spin coater 24 is disposed within each of the coating chambers 22. The number of spin coaters 24 is determined in accordance with the number of types of organic films to be formed by the semiconductor manufacturing apparatus 10. The semiconductor manufacturing apparatus 10 of the present embodiment is configured on the basis of the assumption that two types of organic films are to be formed. Accordingly, two spin coaters 24 are disposed in the coating stage 14. However, the number of types of organic films is not limited to two, and a larger number of organic films may be formed.

A plurality of unit columns 26 are disposed in the hot plate stage 16. Each of the unit columns 26 includes a plurality of hot plate units stacked in a vertical direction (i.e., the direction perpendicular to a drawing sheet of FIG. 1). The plurality of hot plate units disposed in the hot plate stage 16 are set to respective predetermined temperatures.

In the process for forming an organic film on the semiconductor wafer, it may be useful to heat the semiconductor wafer to an appropriate temperature before formation of an organic material through use of the spin coater 22; in other words, it may be useful to perform preliminary heating of the semiconductor wafer. When the preliminary heating is required, a single or a plurality of hot plates are set so as to be a certain pre-heating temperature, and the semiconductor wafer is transported to the spin coater 24 after having been pre-heated by the hot plate unit.

Organic material for forming a resist film or an ARC film is applied to the surface of the semiconductor wafer transported to the spin coater 24, by means of spin-coating. One of the plurality of hot plate units is set to a predetermined baking temperature corresponding to the type of organic film to be formed. In the present embodiment, one hot plate is set to a baking temperature required for growing a resist film, and another hot plate unit is set to a baking temperature required for growing an ARC film. The semiconductor wafer on the spin coater 24 is coated with the organic material before being transported to a hot plate unit whose baking temperature has been set to a temperature suitable for the organic material.

The semiconductor wafer transported to the hot plate unit whose baking temperature has been set to a predetermined temperature is heated on the hot plate over a predetermined period of time. Consequently, a desired organic film is grown on the surface of the semiconductor wafer.

In the process of forming an organic film on a semiconductor wafer, there may be required to control a temperature profile according to which the semiconductor wafer is to be cooled. In such a case, a single or a plurality of hot plate units is set to a cooling temperature. After having been cooled by the hot plate unit, the semiconductor wafer is transported to the carrier stage 12.

The structure of the hot plate unit of the semiconductor manufacturing apparatus 10 according to the first embodiment will next be described by reference to FIG. 2.

Figure 2:
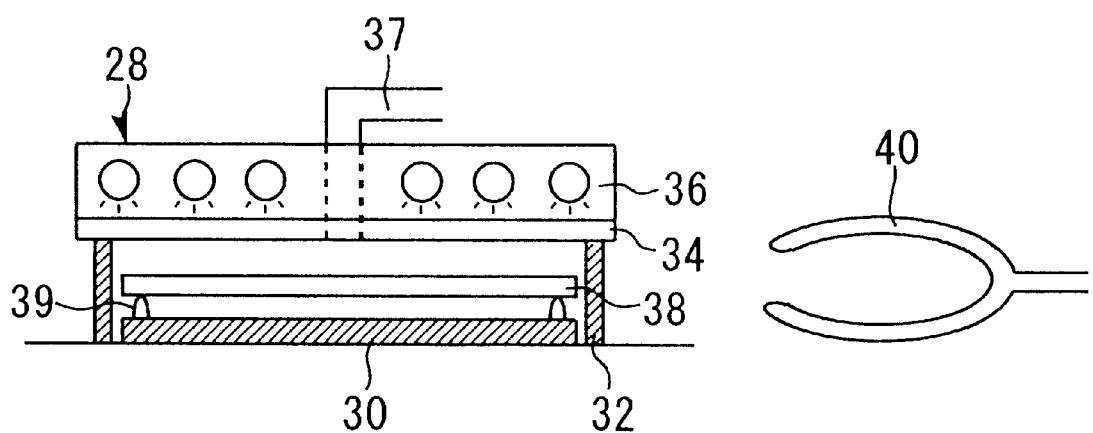
FIG. 2 is a cross-sectional view showing one of the plurality of hot plate units of the semiconductor manufacturing apparatus according to the first embodiment of the present invention.

FIG. 2 is a cross-sectional view showing one of the plurality of hot plate units of the semiconductor manufacturing apparatus 10. The hot plate unit is hereinafter assigned and referred to by reference numeral 28. All the hot plate units provided in the semiconductor manufacturing apparatus 10 are identical in structure with the unit 28 shown in FIG. 2.

The hot plate unit 28 comprises a hot plate 30, a shutter 32, and a top plate 34 on which a light source unit 36 is disposed. An outlet 37 to be brought into communication with the interior space of the hot plate unit 28 is provided in the upper surface of the light source unit 36.

The diameter of the hot plate 30 is substantially identical with that of a semiconductor wafer 38 to be processed, and protuberances 39 for supporting the semiconductor wafer 38 are provided on the surface of the hot plate 30. The shutter 32 is a cylindrical member surrounding the hot plate 30. In FIG. 2, the shutter 32 is moved vertically, thereby hermetically sealing or exposing the interior space of the hot plate unit 28. A transport arm 40 can transport the semiconductor wafer 38 onto or out from the hot plate 30 when the shutter 32 is open.

The top plate 34 is placed in a position above the hot plate 30. In the present embodiment, the top plate 34 is formed from material which permits transmission of UV rays, such as crystal. The light source unit 36 is disposed on the top plate 34 in such a position as to be able to radiate light onto the top plate 34. The light source unit 36 houses a lamp for illuminating light including UV-rays having a wavelength of 175 nm or less or a lamp for illuminating light including UV-rays having a wavelength of 185 nm and UV-rays having a wavelength of 254 nm. The lamp of the light source unit 36 can be embodied by, for example, a xenon lamp for illuminating UV-rays having a wavelength of 172 nm, or a low-pressure mercury lamp for illuminating UV-rays having a wavelength of 185 nm and UV-rays having a wavelength of 254 nm.

As mentioned above, the semiconductor manufacturing apparatus 10 of the present embodiment coats the semiconductor wafer with the organic material by the spin coater 24, before baking the same within the hot plate unit 28 for a predetermined period of time. Organic material to be applied to a semiconductor wafer often contains compounds which sublime during the baking operation. Specifically, organic material used for growing an ARC film contains sublimative dye compounds having an anthracene structure.

If organic material to be baked in the hot plate unit 28 contains such sublimation compounds, the compounds sublime during the baking process, rise while in gaseous form, and sublime upon coming into contact with the top plate 34, to which they then adhere. The compounds adhering to the top plate 34 cause contamination of a semiconductor wafer newly transported into the hot plate unit 28. Therefore, if the amount of compounds adhering to the top plate 34 reaches a predetermined amount, the compounds must be removed from the top plate 34.

It has been known that sublimation compounds contained in the organic material to be used in processes for manufacturing a semiconductor device can be removed upon exposure to UV-rays of predetermined wavelength.

Specifically, UV-rays having a wavelength of 184.9 nm efficiently change oxygen ($O_2$) to ozone ($O_3$). Further, UV-rays having a wavelength of 254 nm efficiently decompose ozone ($O_3$), to thereby form active oxygen (O). Further, light having a wavelength of 175 nm or less is directly absorbed by $O_2$ existing in the atmosphere, thereby forming active oxygen (O). The active oxygen (O) units with another atom or molecular with strong bonding strength and has the ability to decompose an organic substance containing carbon, oxygen, and/or hydrogen, into carbon dioxide and/or water. Accordingly, it is possible to decompose the sublimation compounds (organic compounds) by exposing the compounds to UV-rays having any one of the foregoing wavelengths.

In the semiconductor manufacturing apparatus 10 according to the present embodiment, the light source unit 36 can radiate, onto the top plate 34, light including UV-rays having a wavelength of 175 nm or less or light including UV-rays having a wavelength of 185 nm and UV-rays having a wavelength of 254 nm. Since the top plate 34 is formed from a light-transmissive substance, the light originated from the light source unit 36 can reach the bottom surface of the top plate 34; i.e., the surface to which the sublimation compounds adhere. Therefore, the semiconductor manufacturing apparatus 10 of the present embodiment can thoroughly remove the sublimation compounds adhering to the top plate 34, by illumination of only the light source unit 36.

As mentioned above, in the present embodiment, the compounds adhering to the top plate 34 can be removed without removal of the top plate 34 and a reduction in the temperature of the hot plate 30. In other words, in the present embodiment, the compounds adhering to the top plate 34 can be safely and easily removed within a short period of down time. Thus, the semiconductor manufacturing apparatus 10 can achieve high rate of operation and facilitate maintenance thereof.

In the semiconductor manufacturing apparatus 10 of the present embodiment, every time a predetermined number of semiconductor wafers have been processed by a given hot plate unit, compounds are removed from the hot plate unit. Thus, the semiconductor manufacturing apparatus 10 enables to manage all hot plate units to be clean, and to form organic films at high-yield.

Second Embodiment

A semiconductor manufacturing apparatus according to a second embodiment of the present invention will now be described by reference to FIGS. 1, 3, and 4.

The semiconductor manufacturing apparatus of the present embodiment can be represented in the same plane view of FIG. 1 as used for the semiconductor manufacturing apparatus of the first embodiment. FIG. 3 shows one of a plurality of hot plate units provided in the semiconductor manufacturing apparatus of the present embodiment. The hot plate unit will hereinafter be assigned reference numeral 42. All the hot plate units provided in the semiconductor manufacturing apparatus of the present embodiment are identical in structure with the unit 42 shown in FIG. 3.

The hot plate 42 has a top plate 44 in place of the top plate 34 used in the first embodiment. Since the top plate 44 is not required to possess a light-transmission property, the top plate 44 can be formed from light-shielding material (metal or a like substance) that is less expensive than the light-transmission substance used in the first embodiment. As shown in FIG. 3, a light source unit 46 is placed at a position above the hot plate 30. While the semiconductor manufacturing apparatus is in operation, the light source unit 46 is placed at a predetermined position within the semiconductor manufacturing apparatus, such as a position above the unit columns 26 shown in FIG. 1. Every time the top plate 44 is required to be cleaned, the light source unit 46 is transported on the hot plate 30 by means of the transport arm 40.

Figure 3:
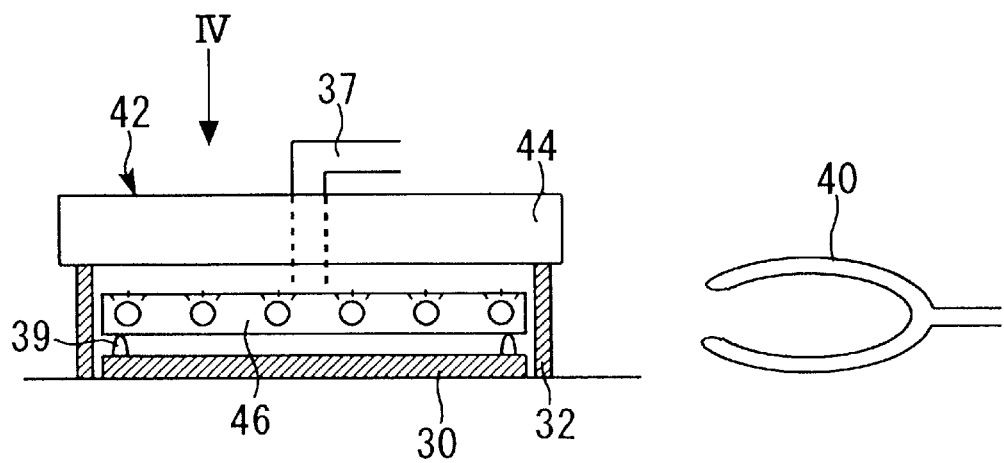
FIG. 3 is a cross-sectional view showing one of the plurality of hot plate units of a semiconductor manufacturing apparatus according to a second embodiment of the present invention.
Figure 4:
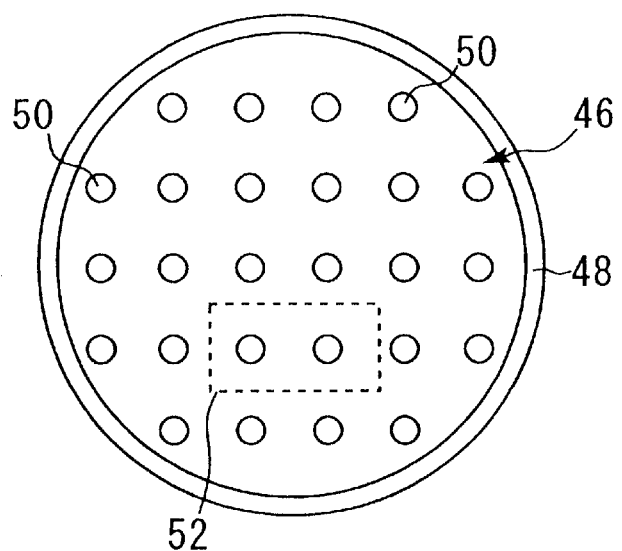
FIG. 4 is a plan view of a light source unit which is used in the hot plate unit provided in the semiconductor manufacturing apparatus according to the second embodiment of the present invention.

FIG. 4 is a plan view of the light source unit 46 when viewed in the direction designated by arrow IV shown in FIG. 3. The light source unit 46 has a disk-shaped housing 48 whose diameter is substantially identical with that of the semiconductor wafer to be processed by the hot plate unit 42. When an 8-inch semiconductor wafer is employed, the diameter of the housing 48 is set to substantially a value of 8 inches. In contrast, when a 12-inch semiconductor wafer is employed, the diameter of the housing 48 is set to substantially a value of 12 inches. Further, the thickness of the housing 48 is set to a value of about 4 cm or less so that the light source unit 46 can be housed within the hot plate unit 42.

A plurality of lamps 50 are disposed over the entirety of the housing 48 at a substantially uniform density. Further, a power supply unit 52 for illuminating the lamps 50 is also provided within the housing 46. As in the case of the lamps incorporated in the light source unit 36 of the first embodiment, the lamps 50 can be embodied by xenon lamps or low-pressure mercury lamps and illuminate light containing UV-rays having a wavelength of 175 nm or less, or light containing UV-rays having a wavelength of 185 nm and UV-rays having a wavelength of 254 nm.

The power supply unit 52 can be embodied by an independent device such as batteries or a device capable of receiving power from an external unit 50 while the light source unit 46 is set in the position above the hot plate 30. Accordingly, the power supply unit 52 can freely move as an independent unit within the semiconductor manufacturing apparatus without being constrained by a power feed line.

The foregoing housing 48 is formed from heat-resistant material (such as metal, heat-resistant resin, or a like substance) capable of withstanding a temperature of about 200° C. Further, the light source unit 46 has a heat-resistant structure which is capable of protecting the lamps 50 and the power supply unit 52 to be housed within the housing 48 from the high-temperature atmosphere of about 200° C. That is, the light source unit 46 is constructed so that it can be continuously used for at least a period of cleaning time (a time required for cleaning sublimation compounds) within the hot plate unit 42 whose temperature is controlled so as to be maintained at a temperature for baking organic material.

In the semiconductor manufacturing apparatus of the present embodiment, every time a predetermined number of semiconductor wafers have been processed in one of the hot plate units, the light source unit 46 is transported into the hot plate unit through use of the transport arm 40. The light source unit 46 transported into the hot plate unit radiates, onto the top plate of the unit (corresponding to the top plate 44), UV-rays effective for decomposing the compounds adhering to the top plate. The compounds can be removed by the light source unit 46 without involvement of a reduction in the temperature of the hot plate. Even the semiconductor manufacturing apparatus of the present embodiment can safely and readily cleanse the hot plate unit within a short period of down time, as in the case of the first embodiment.

Further, the semiconductor manufacturing apparatus of the present embodiment enables cleaning of a plurality of hot plate units through use of only a single light source unit 46. Therefore, the structure described in the present embodiment contributes to less-expensive manufacture of an apparatus which yields the same advantageous result as that yielded by the apparatus of the first embodiment.

Although the light source unit 46 has a heat-resistant structure in the present embodiment, the present invention is not limited to such a structure. Specifically, in a case where the temperature of the hot plate is temporarily reduced for removing compounds, the only essential requirement is that the light source unit 46 have a structure which enables use of the unit in a room-temperature environment.

Third Embodiment

Figure 5:
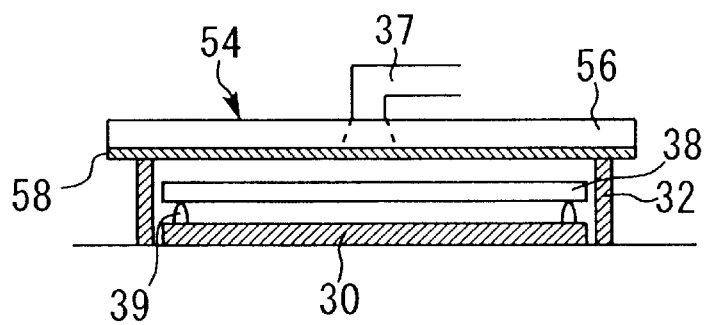
FIG. 5 is a cross-sectional view showing one of the plurality of hot plate units of a semiconductor manufacturing apparatus according to a third embodiment of the present invention.

A semiconductor manufacturing apparatus according to a third embodiment of the present invention will be described by reference to FIG. 5. FIG. 5 is a cross-sectional view showing one of a plurality of hot plate units provided in the semiconductor manufacturing apparatus. The hot plate unit will hereinafter be assigned reference numeral 54. All the hot plates provided in the semiconductor manufacturing apparatus of the present embodiment are identical in structure with the unit 54 shown in FIG. 5.

The hot plate 54 has a top plate 56 in place of the top plate 34 of the first embodiment. The top plate 56 can be formed from light-shielding material that is less expensive than the light-transmissive substance. Further, the top plate 56 is formed so that it can be readily removed from the hot plate unit 54 and taken out of the semiconductor manufacturing apparatus.

In FIG. 5, one surface of the top plate 56; i.e., the surface at which the top plate 56 faces to the wafer 38 within the interior of the hot plate unit 54 (hereinafter referred to as a "facing surface") is covered with a heat-resistant protective film 58. The protective film 58 is previously formed on the facing surface of the top plate 56, illustratively by spraying organic material containing thermosetting resin onto the top plate 56 while the same is taken out to outside of the semiconductor manufacturing apparatus.

Compounds which sublime while the semiconductor wafer 38 is subjected to heat process within the hot plate unit 54 adhere to the surface of the protective film 58, and this protective film 58 can be easily come off from the facing surface of the top plate 56. In the present embodiment, every time a predetermined number of semiconductor wafers 38 have been processed within the hot plate unit 54, there is performed a cleaning operation; specifically, the top plate 56 is taken out of the hot plate unit 54, and the compounds are removed from the top plate 56 together with the protective film 58. After formation of a new protective film 58 on the top plate 56, the top plate 56 is attached to the hot plate unit 54.

In order to perform the foregoing cleaning operation, the temperature of the hot plate unit 54 must be temporarily reduced. Therefore, in contrast with the first and second embodiments, the third embodiment involves a longer down time. However, compared with the conventional cleaning method wherein organic compounds adhering to the top plate are manually eliminated through use of an organic solvent after removal of the top plate from the hot plate unit, the present embodiment requires much lighter and safer burden for the cleaning operation. Further, a mechanism for taking the top plate out of the semiconductor manufacturing apparatus has already been incorporated into an existing semiconductor manufacturing apparatus equipped with hot plate units, and hence the cleaning operation as described in the connection with the present embodiment can be performed without involvement of drastic modification of the conventional semiconductor manufacturing apparatus. In this respect, the semiconductor manufacturing apparatus and the method for cleaning the apparatus according to the present embodiment are effective for diminishing a burden imposed by cleaning operation and inexpensively improving the safety of the cleaning operation.

Although in the first through third embodiments the top plate to which sublimation compounds adhere is described as being applied to the top plate of the hot plate unit, an apparatus capable of employing the present invention is not limited to a hot plate unit. Specifically, the present invention can be applied to a top plate of any of various types of heating units capable of baking a semiconductor wafer coated with organic material.

The major benefits of the present invention described above are summarized as follows:

According to a first aspect of the present invention, a top plate of a heating unit can be exposed to UV-rays. Sublimation organic compounds often adhere to the top plate when a semiconductor wafer is heated within the heating unit. Such compounds can be decomposed upon exposure to UV-rays. Accordingly, the compounds adhering to the top plate can be safely and simply removed within a short period of time.

According to a second aspect of the present invention, since the top plate is light-transmissive, the compounds can be exposed to UV-rays, although the light source is disposed outside the heating unit so as to illuminate the light on the opposite side of the facing surface of the top plate. Further, since the light source unit is disposed outside the heating unit, the facing surface can be exposed to UV-rays while the temperature of the heating unit is maintained close to a temperature for baking organic coating. Thus, the present invention enables safe and easy removal of compounds adhering to the top plate without reducing the temperature of the heating unit and within a short period of down time.

According to a third aspect of the present invention, since the light source unit is disposed on the top plate, a structure for efficiently radiating UV-ray onto compounds can be embodied within minimal space.

According to a fourth aspect of the present invention, UV-rays are radiated from the light source onto the facing surface of the top plate. In this case, compounds can be directly exposed to UV-rays, so that the compounds can be efficiently decomposed. In this case, since the top plate is not required to possess a light-transmissive property, the heating unit can be less expensively embodied than a case where the top plate of the heating unit must have a light-transmissive property.

According to a fifth aspect of the present invention, an independent-type light source unit is transported into the heating unit, and hence the facing surface of the top plate; i.e., compounds adhering to the top plate, can be exposed to UV-rays. Even when a semiconductor manufacturing apparatus comprises a plurality of heating units, those units can be cleaned through use of a single light source unit. Therefore, a semiconductor manufacturing apparatus of the present invention can be manufactured less expensively than the semiconductor manufacturing apparatus of the first aspect, which must be provided with a plurality of light sources units so as to correspond to the respective heating units.

According to a sixth aspect of the present invention, transportation of the light source unit into the heating unit and removal of the light source unit from the heating unit can be automated by employment of a transport arm.

According to a seventh aspect of the present invention, since the light source unit has a heat-resistant structure, the light source unit can be transported into the heating unit while the temperature of the heating unit is maintained at a temperature for baking organic coating. Therefore, the present invention enables safe and easy removal of compounds adhering to the top plate without reduction of the temperature of the heating unit and within a short period of down time.

According to an eighth aspect of the present invention, the top plate can be exposed to UV-rays having a wavelength of 175 nm or less. The UV-rays of 175 nm can form active oxygen (O). Therefore, according to the present invention, compounds adhering to the top plate can be efficiently decomposed.

According to a ninth aspect of the present invention, the top plate can be exposed to UV-rays having a wavelength of 185 nm and UV-rays having a wavelength of 254 nm. UV-rays having a wavelength of 185 nm efficiently change oxygen ($O_2$) into ozone ($O_3$). UV-rays having a wavelength of 254 nm efficiently change ozone ($O_3$) into active oxygen (O). Therefore, the present invention enables efficient decomposition of compounds adhering to the top plate.

According to a tenth aspect of the present invention, the top plate is cleaned every time a predetermined number of semiconductor wafers have been heated within a heating unit. Therefore, the interior of the heating unit can be maintained at a clean state at all times, and semiconductor wafers can be effectively protected from contamination with compounds.

According to an eleventh aspect of the present invention, a protective film is previously formed on the top plate. As a result, sublimation compounds stemming from heating of a semiconductor wafer adhere to the protective film. By removal of the compounds from the top plate in conjunction with the protective film, the top plate can be safely and readily cleaned.

According to a twelfth aspect of the present invention, a new protective film is formed on the top plate every time a predetermined number of semiconductor wafers have been heated within the heating unit. Thus, the interior of the heating unit can be maintained at a clean state at all times, and semiconductor wafers can be effectively protected from contamination with compounds.

According to a thirteenth aspect of the present invention, there is embodied an independent-type light source unit which can be transported into a heating unit for heating a semiconductor wafer. Further, the light source unit enables exposure of the entire top plate of the heating unit to UV-rays with substantially uniform illumination. Therefore, the light source unit enables easy cleaning of an existing heating unit.

According to a fourteenth aspect of the present invention, there can be embodied an independent-type light source unit which produces UV-rays useful for forming active oxygen (O).

According to a fourteenth aspect of the present invention, there can be embodied an independent-type light source unit which produces UV-rays useful for changing oxygen ($O_2$) into ozone ($O_3$) and UV-rays useful for changing ozone ($O_3$) into active oxygen (O).

According to a fourteenth aspect of the present invention, there can be embodied an independent-type light source unit which can be transported into a heating unit without a reduction in the temperature of the heating unit.

Further, the present invention is not limited to these embodiments, but variations and modifications may be made without departing from the scope of the present invention.

The entire disclosure of Japanese Patent Application No. Hei 11-254571 filed on Sep. 7, 1999 including specification, claims, drawings and summary are incorporated herein by reference in its entirety.

What is claimed is:

1. A semiconductor manufacturing apparatus including a coating chamber for coating an organic film on a semiconductor wafer and a heating unit for heating the organic film-coated semiconductor wafer, the apparatus comprising:

a top plate which is positioned above a semiconductor wafer to be processed within the heating unit and which has a facing surface facing to the semiconductor wafer and a non-facing surface provided on an opposite side of the top plate; and a light surface unit for radiating light including UV-rays having a predetermined wavelength onto the facing surface of the top plate.

2. The semiconductor manufacturing apparatus according to claim 1, further comprising a transport arm for transporting the light source unit into the heating unit and transporting the light source out from the heating unit.

3. The semiconductor manufacturing apparatus according to claim 2, wherein the light source unit has a heat-resistant structure capable of withstanding a temperature for baking an organic film to be formed on the surface of the semiconductor wafer.

4. The semiconductor manufacturing apparatus according to claim 1, wherein the light source unit can illuminate light including UV-rays having a wavelength of 175 nm or less.

5. The semiconductor manufacturing apparatus according to claim 4, wherein the light source unit can illuminate light including UV-rays having a wavelength of 185 nm and UV-rays having a wavelength of 254 nm.

6. The semiconductor manufacturing apparatus according to claim 1, wherein the light source unit radiates the UV-rays onto the top plate over a predetermined period of time every time a predetermined number of semiconductor wafers have been processed within the heating unit.

7. A method for cleaning a semiconductor manufacturing apparatus including a heating unit for forming an organic film on the surface of a semiconductor wafer, the method comprising:

a step of transporting into the heating unit a light source unit comprising lamps for illuminating light including UV-rays having a predetermined wavelength and a power supply unit for illuminating the lamps;

a step of exposing a top plate of the heating unit to the light including UV-rays, wherein said top plate is positioned above the semiconductor wafer during wafer processing in the heating unit; and a step of transporting the light source unit out from the heating unit after light has been illuminated from the light source unit.

8. The cleaning method according to claim 7, wherein the step of exposing the top plate to the light including UV-rays is performed while the temperature of the heating unit is maintained substantially at a temperature for baking the organic film.

9. The cleaning method according to claim 7, wherein the predetermined wavelength comprises a wavelength of 175 nm or less.

10. The cleaning method according to claim 9, wherein the predetermined wavelength comprises a wavelength of 185 nm and a wavelength of 254 nm.

11. The cleaning method according to claim 7, wherein the step for exposing the top plate to the light including UV-rays is performed every time a predetermined number of semiconductor wafers have been processed within the heating units.

* * * * *